US006812148B2

(12) United States Patent
Chang et al.

(10) Patent No.: US 6,812,148 B2
(45) Date of Patent: Nov. 2, 2004

(54) PREVENTING GATE OXICE THINNING EFFECT IN A RECESS LOCOS PROCESS

(75) Inventors: Chieh-Ju Chang, Hsinchu (TW); Tsai-Sen Lin, Hsinchu (TW); Chon-Shin Jou, Hsinchu (TW); Yifu Chung, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 280 days.

(21) Appl. No.: 10/219,094

(22) Filed: Aug. 13, 2002

(65) Prior Publication Data
US 2004/0031772 A1 Feb. 19, 2004

(51) Int. Cl.[7] .............................................. H01L 21/311
(52) U.S. Cl. ........................ 438/694; 438/297; 438/369
(58) Field of Search ................................ 438/694, 723, 438/297, 369, 376

(56) References Cited
U.S. PATENT DOCUMENTS 4,045,249 A * 8/1977 Hotta .......................... 438/362
5,182,226 A * 1/1993 Jang ........................... 438/297
6,133,164 A * 10/2000 Kim ........................... 438/275
6,284,580 B1 * 9/2001 Takehiro ...................... 438/197

* cited by examiner

Primary Examiner—Kin-Chan Chen
(74) Attorney, Agent, or Firm—Townsend and Townsend and Crew LLP

(57) ABSTRACT

Embodiments of the present invention relate to a method for preventing gate oxide thinning in a recess LOCOS process. The plurality of trenches are separated by a patterned pad oxide and a patterned silicon nitride layer The patterned silicon nitride layer and the patterned pad oxide layer are removed to expose a surface of the substrate as an active area of the semiconductor device. An ion drive-in to the active area on the substrate is performed by directing a flow of oxygen and nitrogen toward the substrate at a predetermined temperature and with a sufficient amount of oxygen to at least substantially prevent silicon nitride from forming on the field oxide regions. The method further comprises forming a sacrificial oxide layer on the active area, removing the sacrificial oxide layer to expose the active area, and forming a gate oxide layer on the active area.

20 Claims, 4 Drawing Sheets

PREVENTING GATE OXICE THINNING EFFECT IN A RECESS LOCOS PROCESS

BACKGROUND OF THE INVENTION

The present invention relates to semiconductor manufacturing and, more particularly, to the formation of gate oxides and preventing or minimizing gate oxide thinning in gate oxides.

An integrated circuit (IC) consists of thousands of transistors such as metal oxide semiconductors (MOSs). A field oxide (FOX) is disposed between two transistors for insulating the transistors in an IC to prevent short circuit. A gate oxide usually underlies the gate of a transistor and the transistor induces charge through the gate oxide. In the conventional method for forming gate oxide, a FOX is formed on a semiconductor substrate by using local oxidation of silicon (LOCOS) and then a well drive-in process is applied. Because the FOX is in ambient nitrogen at high temperatures during the well drive-in process, a residual nitride such as $Si_3N_4$ is formed at a partial edge of the FOX. The residual nitride results in gate oxide thinning at the partial edge of the FOX during formation of the gate oxide.

FIGS. 1A to 1E show a known method for forming a gate oxide on the semiconductor device in which gate oxide thinning occurs. In FIG. 1A, a pad oxide layer 12 and a silicon nitride layer ($Si_3N_4$) 14 are formed on a semiconductor substrate 10, respectively.

In FIG. 1B, lithography and etching form the patterned silicon nitride layer 14a and patterned pad oxide layer 12a to expose the surfaces of the substrate 10. Then, the patterned silicon nitride layer 14a is used as a hard mask to etch the surfaces to form trenches 11 in the substrate 10.

In FIG. 1C, the FOX (field oxide) layers 16 are formed in the trenches 11 by wet oxidation. Then, the patterned silicon nitride layer 14a and patterned pad oxide layer 12a are removed to expose the surface of the substrate 10. The exposed region serves as an active area (AA) 10a of the semiconductor device. Subsequently, the ion drive-in process is applied to the active area 10a by injecting nitrogen gas at a high temperature.

In FIG. 1D, a sacrificial oxide layer 18 such as silicon dioxide($SiO_2$) is formed on the AA 10a. Prior to forming the sacrificial oxide layer 18, silicon nitride (not shown) is formed on the AA 10a and the partial edges of the FOX layers 16 (i.e., the regions "A" shown in FIG. 1D) due to exposure of the AA 10a to the nitrogen gas at high temperatures for an extended period of time.

In FIG. 1E, the sacrificial oxide layer 18 is removed, thereby removing the silicon nitride on the AA 10a. Subsequently, an oxide layer 19 is formed on the AA 10a to serve as the gate oxide layer of the semiconductor device by dry oxidation. Only the silicon nitride formed on AA 10a is removed with the sacrificial oxide layer 18. The silicon nitride formed in the partial edge region "A" as seen in FIG. 1D often cannot be removed during the removal of the sacrificial oxide layer 18, but remains as the residual silicon nitride prior to formation of the gate oxide. The oxidation rate of the FOX layers 16 near the residual silicon nitride (i.e., the regions "A" in FIG. 1D) is lower than that of the surface of the AA 10a when the gate oxide layer 19 is formed. As a result, the gate oxide layer 19 that is formed at the juncture between the FOX layers 16 and the AA 10a is thinner, as shown in regions "B" in FIG. 1E. The thinner gate oxide layer 19 causes the increment of the leakage current and the reduction of the breakdown voltage of the semiconductor device.

BRIEF SUMMARY OF THE INVENTION

Embodiments of the present invention relate to a method for preventing gate oxide thinning in a recess LOCOS process. This is achieved by introducing a mixture of oxygen gas and nitrogen gas, typically at an elevated temperature, into the region in which the substrate is disposed during the ion drive-in to the active area of the semiconductor substrate. The affinity for oxygen with silicon is higher than that for nitrogen with silicon. As a result, oxygen can be used to prevent or reduce silicon nitride formation on the field oxide regions. The amount of oxygen is selected to be sufficient to at least substantially prevent silicon nitride from forming in the field oxide regions, thereby preventing or reducing gate oxide thinning during the subsequent formation of the gate oxide due to the presence of residual silicon nitride. In specific embodiments, an upper oxide layer is formed on the active area during the ion drive-in to the active region. The upper silicon oxide layer 28 can prevent an excess of nitrogen bonds with silicon from forming in the active area to produce a lot of silicon nitride ($Si_3N_4$), which can be difficult to remove before forming the gate oxide layer.

In accordance with an aspect of the present invention, a method of forming a gate oxide on a substrate comprises providing a substrate having thereon a plurality of trenches separated by a patterned pad oxide and a patterned silicon nitride layer disposed thereon and used to form the plurality of trenches. A plurality of first oxide layers are formed in the trenches as field oxides of a semiconductor device. The patterned silicon nitride layer and the patterned pad oxide layer are removed to expose a surface of the substrate as an active area of the semiconductor device. A flow of oxygen and nitrogen with a predetermined flow ratio is introduced for performing an ion drive-in to the active area at a predetermined temperature. The method further comprises forming a second oxide layer on the active area, removing the second oxide layer to expose the active area, and forming a third oxide layer on the active area as a gate oxide of the semiconductor device.

In some embodiments, the predetermined flow ratio of the oxygen to the nitrogen is in a range of about 0.5% to about 2%. The fourth oxide layer is formed by a dry oxidation process. The thickness of the fourth oxide layer is in a range of 100 Å to 200 Å. The first oxide layers are formed by a wet oxidation process. The predetermined temperature for the ion drive-in is in a range of about 800° C. to about 1200° C. The second oxide layer is a sacrificial oxide layer comprising silicon dioxide. The third oxide layer is formed by a dry oxidation process. A fourth oxide layer is formed on the active area during the ion drive-in to the active area. The trenches are formed by using an etching process.

Another aspect of the present invention is directed to a method of preventing or reducing gate oxide thinning in a recess LOCOS process for a substrate including thereon an active area and field oxide regions disposed adjacent the active area. The method comprises performing an ion drive-in to the active area on the substrate by directing a flow of oxygen and nitrogen toward the substrate at a predetermined temperature and with a sufficient amount of oxygen to at least substantially prevent silicon nitride from forming on the field oxide regions. The method further comprises forming a sacrificial oxide layer on the active area, removing the sacrificial oxide layer to expose the active area, and forming a gate oxide layer on the active area.

In some embodiments, the flow of oxygen and nitrogen comprises $O_2$ and $N_2$ at a ratio of about 0.5% to about 2% $O_2/N_2$. During the ion drive-in to the active area, a residual nitride is formed on the active area and an upper oxide layer is formed over the residual nitride. The upper oxide layer has a thickness of about 100 Å to about 200 Å. The residual nitride and the upper oxide layer are removed during removal of the sacrificial oxide layer.

In accordance with another aspect of the invention, a method of forming a gate oxide on a substrate comprises providing a substrate having thereon a plurality of trenches having gate oxides formed therein, wherein the plurality of trenches are separated by a patterned pad oxide and a patterned silicon nitride layer disposed thereon and used to form the plurality of trenches. The patterned silicon nitride layer and the patterned pad oxide layer are removed to expose a surface of the substrate as an active area of the semiconductor device. An ion drive-in to the active area on the substrate is performed by directing a flow of oxygen and nitrogen toward the substrate at a predetermined temperature and with a sufficient amount of oxygen to at least substantially prevent silicon nitride from forming on the field oxide regions. The method further comprises forming a sacrificial oxide layer on the active area, removing the sacrificial oxide layer to expose the active area, and forming a gate oxide layer on the active area.

DETAILED DESCRIPTION OF THE INVENTION

Figure 1A:
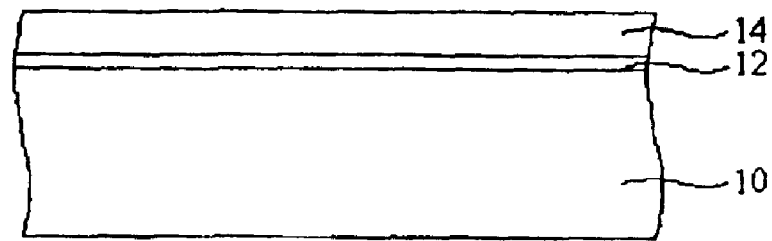
FIGS. 1A–1E are schematic cross-sectional views illustrating a known method for forming a gate oxide layer on a semiconductor substrate.
Figure 1B:
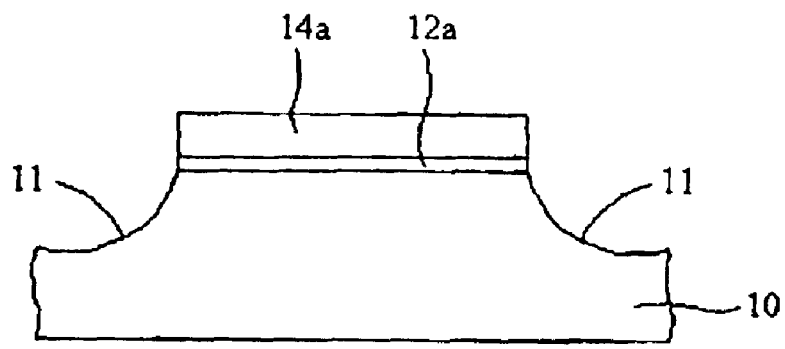
Figure 1C:
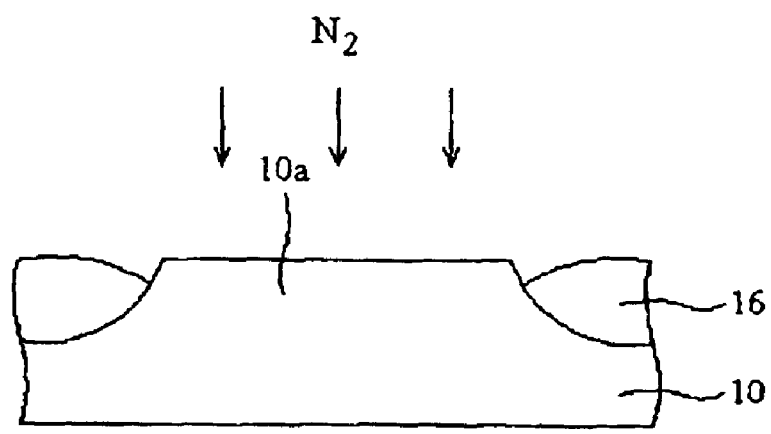
Figure 1D:
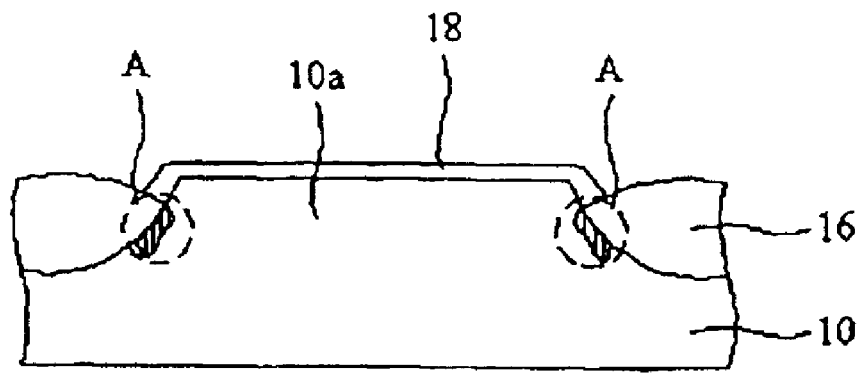
Figure 1E:
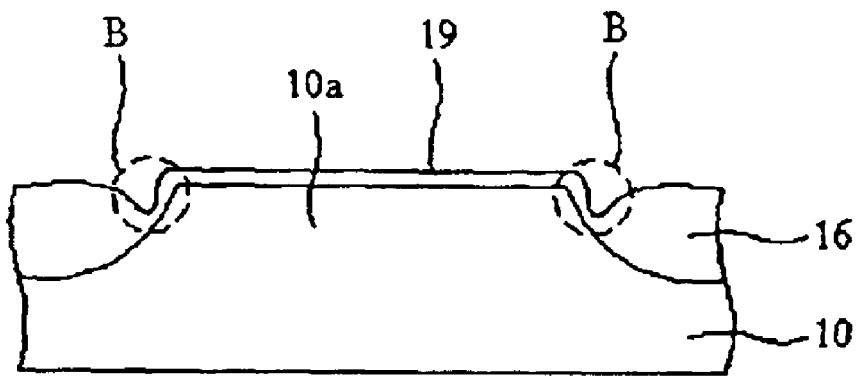
Figure 2A:
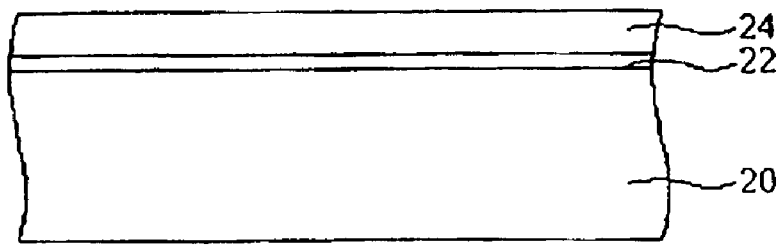
FIGS. 2A–2E are schematic cross-sectional views illustrating a method for preventing gate oxide layer thinning on a semiconductor substrate in accordance with an embodiment of the present invention.

In FIG. 2A, a pad oxide layer 22 such as a silicon dioxide layer and a silicon nitride ($Si_3N_4$) layer 24 are formed on a semiconductor 20 in order.

Figure 2B:
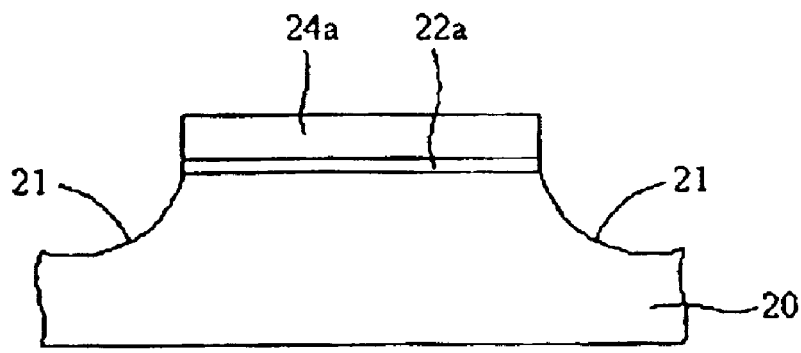

In FIG. 2B, lithography and etching form the patterned silicon nitride layer 24a and patterned pad oxide layer 22a to expose the surfaces of the substrate 20. Then, the patterned silicon nitride layer 24a is used as a hard mask to etch the surfaces to form trenches 21 in the substrate 10. Trenches 21 are formed to obtain a flat surface of the substrate 20 after a field oxide (FOX) layers are formed in trenches 21. Achieving a flatter surface than otherwise possible without first forming the trenches 21 is an advantage of the recess LOCOS process.

Figure 2C:
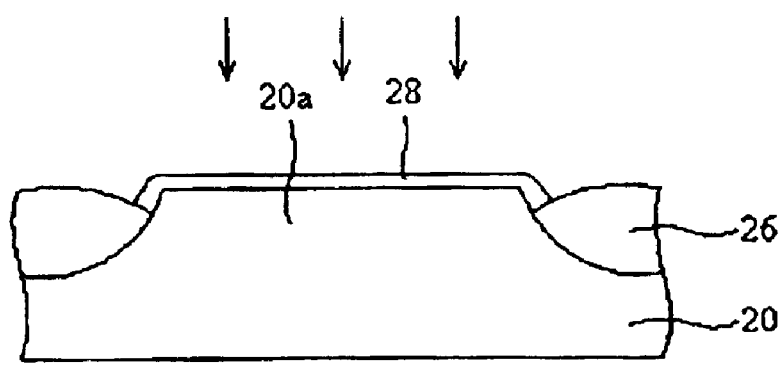

In FIG. 2C, first oxide layers 26 are formed in the trenches 21 by wet oxidation to serve as FOX layers. Then, the patterned silicon nitride layer 24a and patterned pad oxide layer 22a are removed to expose the surface of the substrate 20. The exposed region serves as an active area (AA) 20a of the semiconductor device. Then, a mixture of oxygen gas and nitrogen gas having a predetermined flow ratio ($O_2/N_2$) of, e.g., about 0.5% to about 2%, is injected. An ion drive-in process is carried out in the presence of the mixture of oxygen and nitrogen at a high temperature which may be, for example, about 800° C. to about 1200° C. At the same time, an upper oxide layer ("fourth" oxide layer) 28 is formed on the AA 20a by dry oxidation. The upper oxide layer may be, for example, a silicon dioxide layer with a thickness of about 100 Å to about 200 Å. The silicon oxide layer 28 can prevent an excess of nitrogen bonds with silicon from forming in the AA 20a to produce a lot of silicon nitride ($Si_3N_4$), which can be difficult to remove at a later stage prior to formation of the gate oxide. Furthermore, since the affinity for oxygen with silicon is higher than that for nitrogen with silicon, injecting oxygen gas can effectively prevent silicon nitride from forming in the partial edges of the FOX layers 26.

Figure 2D:
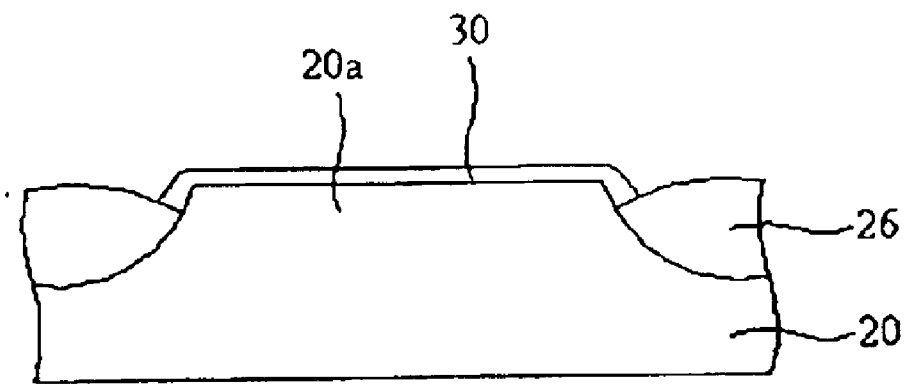

In FIG. 2D, after the ion drive-in, the nitrogen still permeates through the fourth oxide layer 28 to form residual silicon nitride (not shown) on the AA 20a. To address this, another oxide layer ("second" oxide layer) 30 such as a silicon dioxide layer is formed on the AA 20a. The fourth oxide layer 28 and residual silicon nitride (not shown) on the surface of the AA 20a are contained in the second oxide layer 30 as shown in FIG. 2D, which serves as a sacrificial oxide layer.

Figure 2E:
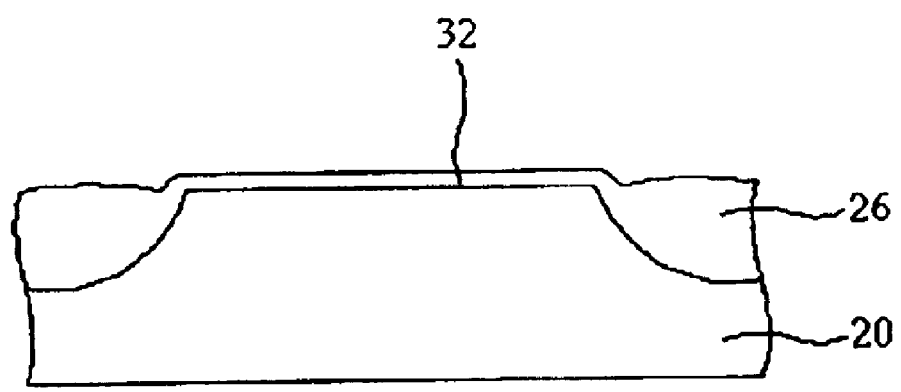

In FIG. 2E, the sacrificial oxide layer 30 is removed or stripped, thereby removing residual silicon nitride as mentioned above. Then, another oxide layer ("third" oxide layer) 32 is formed on the AA 20a that serves as a gate oxide layer for a semiconductor device by dry oxidation. Since no residual silicon nitride is formed in the partial edges of the FOX layer 26 and the residual silicon nitride formed on the AA 20a is removed, there is no oxidation rate differential to induce gate oxide thinning.

The processes as described above are typically performed in one or more process chambers which include systems for controlling gas flow through the chamber, temperature and pressure in the chamber, and the like. Various chambers which may be suitable for carrying out the processes of the present invention are known in the art.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method of forming a gate oxide on a substrate, the method comprising:

providing a substrate having thereon a plurality of trenches separated by a patterned pad oxide and a patterned silicon nitride layer disposed thereon and used to form the plurality of trenches;

forming a plurality of first oxide layers in the trenches as field oxides of a semiconductor device;

removing the patterned silicon nitride layer and the patterned pad oxide layer to expose a surface of the substrate as an active area of the semiconductor device;

introducing a flow of oxygen and nitrogen with a predetermined flow ratio for performing an ion drive-in to the active area at a predetermined temperature;

forming a second oxide layer on the active area;

removing the second oxide layer to expose the active area; and forming a third oxide layer on the active area as a gate oxide of the semiconductor device.

2. The method of claim 1 wherein the predetermined flow ratio of the oxygen to the nitrogen is in a range of about 0.5% to about 2%.

3. The method of claim 1 wherein a fourth oxide layer is formed on the active area during the ion drive-in to the active area.

4. The method of claim 3 wherein the fourth oxide layer is formed by a dry oxidation process.

5. The method of claim 3 wherein the thickness of the fourth oxide layer is in a range of 100 Å to 200 Å.

6. The method of claim 1 wherein the predetermined temperature for the ion drive-in is in a range of about 800° C. to about 1200° C.

7. The method of claim 1 wherein the second oxide layer is a sacrificial oxide layer comprising silicon dioxide.

8. The method of claim 1 wherein the third oxide layer is formed by a dry oxidation process.

9. The method of claim 1 wherein forming the trenches by using an etching process.

10. The method of claim 1 wherein the first oxide layers are formed by a wet oxidation process.

11. A method of preventing or reducing gate oxide thinning in a recess LOCOS process for a substrate including thereon an active area and field oxide regions disposed adjacent the active area, the method comprising:

performing an ion drive-in to the active area on the substrate by directing a flow of oxygen and nitrogen toward the substrate at a predetermined temperature and with a sufficient amount of oxygen to at least substantially prevent silicon nitride from forming on the field oxide regions;

forming a sacrificial oxide layer on the active area;

removing the sacrificial oxide layer to expose the active area; and forming a gate oxide layer on the active area.

12. The method of claim 11 wherein the flow of oxygen and nitrogen comprises $O_2$ and $N_2$ at a ratio of about 0.5% to about 2%.

13. The method of claim 11 wherein, during the ion drive-in to the active area, a residual nitride is formed on the active area and an upper oxide layer is formed over the residual nitride.

14. The method of claim 13 wherein the upper oxide layer has a thickness of about 100 Å to about 200 Å.

15. The method of claim 13 wherein the residual nitride and the upper oxide layer are removed during removal of the sacrificial oxide layer.

16. The method of claim 11 wherein the predetermined temperature for the ion drive-in is between about 800° C. and about 1200° C.

17. A method of forming a gate oxide on a substrate, the method comprising:

providing a substrate having thereon a plurality of trenches having gate oxides formed therein, the plurality of trenches being separated by a patterned pad oxide and a patterned silicon nitride layer disposed thereon and used to form the plurality of trenches;

removing the patterned silicon nitride layer and the patterned pad oxide layer to expose a surface of the substrate as an active area of the semiconductor device;

performing an ion drive-in to the active area on the substrate by directing a flow of oxygen and nitrogen toward the substrate at a predetermined temperature and with a sufficient amount of oxygen to at least substantially prevent silicon nitride from forming on the field oxide regions;

forming a sacrificial oxide layer on the active area;

removing the sacrificial oxide layer to expose the active area; and forming a gate oxide layer on the active area.

18. The method of claim 17 wherein the flow of oxygen and nitrogen comprises $O_2$ and $N_2$ at a ratio of about 0.5% to about 2%.

19. The method of claim 17 wherein the predetermined temperature for the ion drive-in is between about 800° C. and about 1200° C.

20. The method of claim 17 wherein, during the ion drive-in to the active area, a residual nitride is formed on the active area and an upper oxide layer is formed over the residual nitride, and wherein the residual nitride and the upper oxide layer are removed during removal of the sacrificial oxide layer.

* * * * *